(12) United States Patent
Prajuckamol et al.

(10) Patent No.: US 12,211,775 B2
(45) Date of Patent: Jan. 28, 2025

(54) MULTIPLE SUBSTRATE PACKAGE SYSTEMS AND RELATED METHODS

(71) Applicant: SEMICONDUCTOR COMPONENTS INDUSTRIES, LLC, Phoenix, AZ (US)

(72) Inventors: Atapol Prajuckamol, Thanyaburi (TH); Chee Hiong Chew, Seremban (MY); Yusheng Lin, Phoenix, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 432 days.

(21) Appl. No.: 17/126,433

(22) Filed: Dec. 18, 2020

(65) Prior Publication Data

US 2022/0199502 A1    Jun. 23, 2022

(51) Int. Cl.
*H01L 23/498* (2006.01)
*H01L 21/48* (2006.01)
*H01L 23/31* (2006.01)
*H01L 23/538* (2006.01)
*H01L 25/18* (2023.01)
*H01L 23/24* (2006.01)

(52) U.S. Cl.
CPC .... *H01L 23/49811* (2013.01); *H01L 21/4803* (2013.01); *H01L 21/4842* (2013.01); *H01L 21/4853* (2013.01); *H01L 23/3107* (2013.01); *H01L 23/49833* (2013.01); *H01L 23/5385* (2013.01); *H01L 25/18* (2013.01); *H01L 23/24* (2013.01)

(58) Field of Classification Search
CPC .......... H01L 23/49811; H01L 23/3107; H01L 23/49833; H01L 23/5385; H01L 21/4803; H01L 21/4842; H01L 21/4853; H01L 25/18
USPC ......................................................... 257/668
See application file for complete search history.

(56) References Cited

U.S. PATENT DOCUMENTS

| | | |
|---|---|---|
| 9,704,819 B1 | 7/2017 | Gao et al. |
| 11,127,659 B2* | 9/2021 | Xu .......................... H01L 23/32 |
| 2007/0257343 A1 | 11/2007 | Hauenstein et al. |
| 2009/0218666 A1 | 9/2009 | Yang |
| 2013/0140684 A1 | 6/2013 | Hauenstein |
| 2015/0228571 A1* | 8/2015 | Shiraki ................... H01L 24/97 257/701 |
| 2020/0035580 A1* | 1/2020 | Hoegerl ................ H01L 23/367 |
| 2020/0303285 A1* | 9/2020 | Dadvand ............. H01L 21/4821 |

FOREIGN PATENT DOCUMENTS

| | | |
|---|---|---|
| DE | 102018123857 A1 | 4/2019 |
| DE | 102018219926 A1 | 5/2019 |
| DE | 102019115513 A1 | 12/2019 |
| JP | H0595079 A | 11/1991 |

* cited by examiner

*Primary Examiner* — Quoc D Hoang
(74) *Attorney, Agent, or Firm* — IPTechLaw LLC

(57) ABSTRACT

Implementations of a semiconductor package may include a first substrate including a first group of leads physically coupled thereto and a second group of leads physically coupled thereto; a second substrate coupled over the first substrate and physically coupled to the first group of leads and the second group of leads; and one or more semiconductor die coupled between the first substrate and the second substrate. The second group of leads may be electrically isolated from the first substrate.

20 Claims, 5 Drawing Sheets

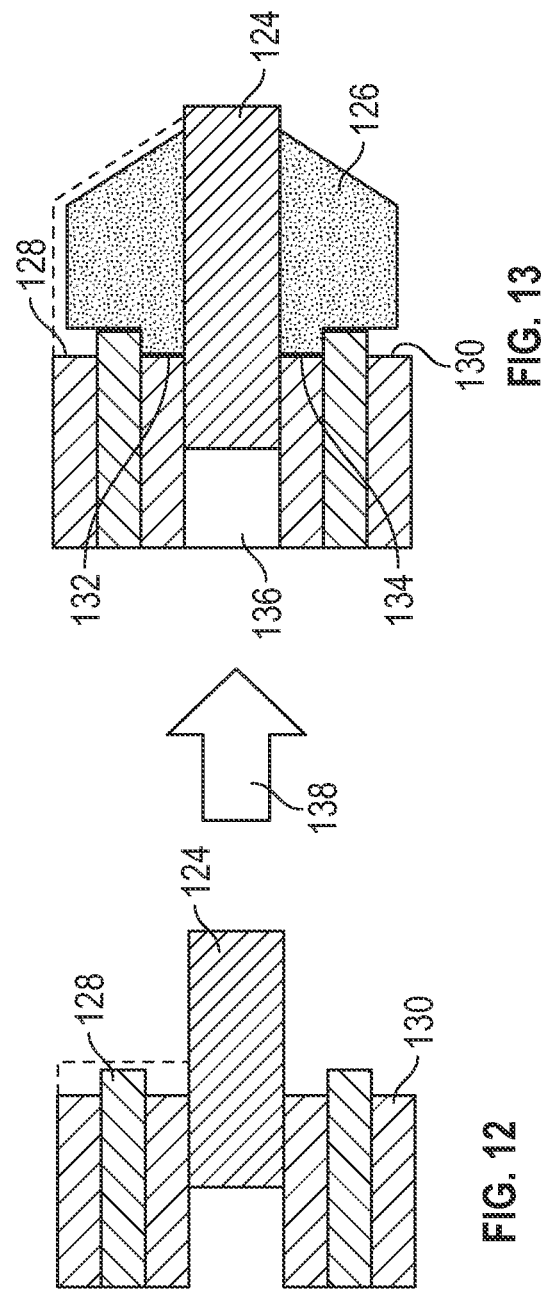

MULTIPLE SUBSTRATE PACKAGE SYSTEMS AND RELATED METHODS

BACKGROUND

1. Technical Field

Aspects of this document relate generally to semiconductor packages, such as systems for protecting an enabling electrical contacts for semiconductor devices.

2. Background

Semiconductor packages are used to protect a die from environmental factors such as immunity, temperature, and electrostatic discharge. Semiconductor devices in a semiconductor package may perform a wide variety of functions as part of a larger electrical circuit or system.

SUMMARY

Implementations of a semiconductor package may include a first substrate including a first group of leads physically coupled thereto and a second group of leads physically coupled thereto; a second substrate coupled over the first substrate and physically coupled to the first group of leads and the second group of leads; and one or more semiconductor die coupled between the first substrate and the second substrate. The second group of leads may be electrically isolated from the first substrate.

Implementations of semiconductor packages may include one, all, or any of the following:

The second group of leads may be each coupled to a corresponding electrically isolated copper island formed in a layer of copper on the first substrate.

The package may include an encapsulant in a space between the first substrate and the second substrate.

The first group of leads and the second group of leads may be both coupled on a same side of the first substrate and on a same side of the second substrate.

The first group of leads and the second group of leads may be coupled on different sides of the first substrate and the second substrate.

The package may include one or more leads physically and electrically coupled to the first substrate and to the second substrate.

The package may include where an end of each lead of the first group of leads and an end of each lead of the second group of leads may be coined.

The package may include a pre-mold encapsulant formed around the first group of leads and the second group of leads.

Implementations of a semiconductor package may include a first substrate including a first group of leads physically coupled thereto and a second group of leads physically coupled thereto, the second group of leads physically coupled to corresponding electrically isolated islands coupled to the first substrate; a second substrate coupled over the first substrate and physically coupled to the first group of leads and the second group of leads; and one or more semiconductor die coupled between the first substrate and the second substrate.

Implementations of the semiconductor package may include one, all, or any of the following:

The package may include an encapsulant in a space between the first substrate and the second substrate.

The first group of leads and the second group of leads may be both coupled on a same side of the first substrate and on a same side of the second substrate.

The first group of leads and the second group of leads may be coupled on different sides of the first substrate and the second substrate.

The package may include one or more leads physically and electrically coupled to the first substrate and to the second substrate.

An end of each lead of the first group of leads and an end of each lead of the second group of leads may be coined.

The package may include a pre-mold encapsulant formed around the first group of leads and the second group of leads.

Implementations of a method of forming a semiconductor package may include physically and electrically coupling a first group of leads to a first substrate; physically coupling a second group of leads to the first substrate using corresponding electrically isolated islands coupled to the first substrate; physically and electrically coupling a second substrate to the first group of leads and to the second group of leads; and coupling one or more semiconductor die between the first substrate and the second substrate.

Implementations of a method of forming a semiconductor package may include one, all, or any of the following:

The method may include coining the first group of leads and the second group of leads.

The method may include applying a pre-mold encapsulant around the first group of leads and around the second group of leads.

Implementations of a method may include applying an encapsulant between the first substrate and the second substrate.

The first group of leads and the second group of leads may be coupled on one of a same side of the first substrate or different sides of the first substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 12 is a detail cross sectional view of a lead prior to a pre-mold process; and FIG. 13 is a detail cross sectional view of the lead of FIG. 12 following a pre-mold molding process and a mold/gel filling process.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
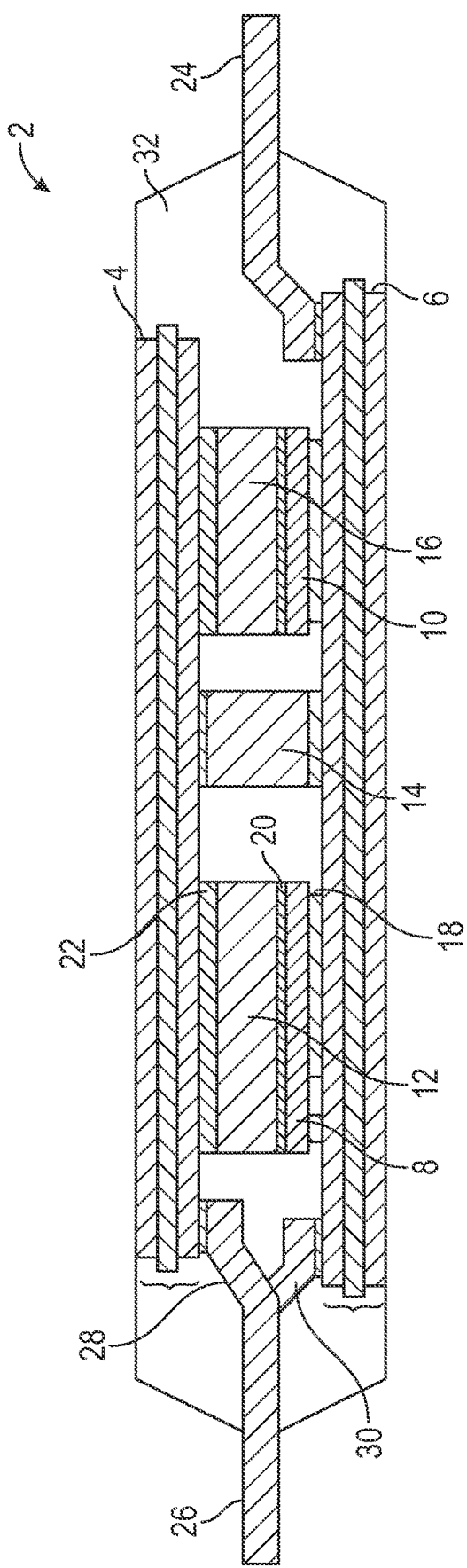
FIG. 1 is a cross sectional view of a first implementation of a semiconductor package with two substrates therein.

Referring to FIG. 1, an implementation of a semiconductor package 2 is illustrated. As illustrated the semiconductor package 2 includes two substrates 4, 6. In this implementation, the substrates 4, 6 are direct bonded copper (DBC) substrates that have 2 layers of copper bonded to each side of a dielectric material. While not illustrated in the cross sectional view of FIG. 1, the surface of the electrically conductive layer of each of the substrates 4, 6 that faces the interior of the package includes various traces formed therein allow for electrical routing and physical and mechanical attachment of one or more semiconductor die and other passive/active electrical components inside the package to the substrate. In this particular implementation, the package includes an insulated gate bipolar transistor (IGBT) 8 and a fast recovery diode (FRD) 10. Spacers 12, 14, and 16 are used to ensure that sufficient distance between the first substrate 4 and the second substrate 6 is maintained. Various layers of solder 18, 20, and 22 are used to couple the spacers 12, 14, and 16 and the die 8, 10 to the first substrate 4 and the second substrate 6. The external electrical connections of the package 2 are made through leads 24, 26 which, during manufacture, were coupled to/part of a lead frame. Because lead 26 is electrically connected to both the first substrate 4 and to the second substrate 6, lead 26 includes an upset portion 28 and a downset portion 30. The thickness of the spacers 12, 14, 16 and the solders all add to the overall thickness of the package 2. In various implementations, the ability to thin the package design illustrated in FIG. 1 may be determined by the minimum distance that needs to be maintained between lead 24 and substrate 4 to ensure that, at the operating voltage and current of the package, the encapsulating material 32 is able to provide sufficient electrical isolation. In various implementations, the lead's 26 upset and downset may be the limiting factor on how thin the package 2 can become.

Figure 2:
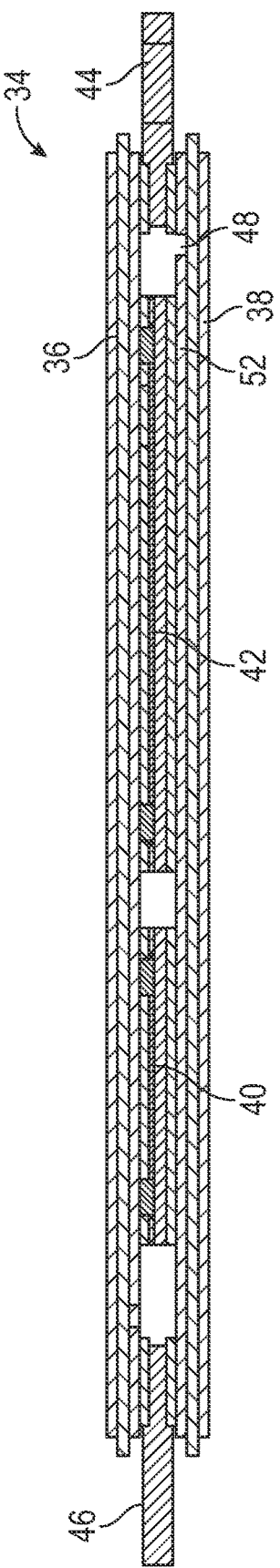
FIG. 2 is a cross sectional view of a second implementation of a semiconductor package with two substrates therein

Referring to FIG. 2, another implementation of a semiconductor package 34 is illustrated in cross section that also includes a first substrate 36 and a second substrate 38 and two semiconductor devices 40, 42. In this implementation, there are no physically separate spacers from the semiconductor devices 40, 42 as the die are coupled to the first substrate 36 and the second substrate 38 through the various pads of the semiconductor devices 40, 42. In this implementation, external electrical connections for the package take the form of lead 44 and lead 40 which are both physically coupled to both the first substrate 36 and the second substrate 38. In this implementation, a gap 48 is provided in the electrically conductive material of the second substrate 38 that faces the semiconductor devices 40, 42 and which electrically isolates the lead 44 from the second substrate 38. As illustrated in FIG. 2 the leads 46, 44 both have coined or thinned ends which allow the thickness of the lead coupled between the substrates to be thinner than the overall thickness of each lead measured in a direction perpendicular with a cross-section of the package. As illustrated in FIG. 2, the package 34 includes no spacers and the leads 44, 46 do not need to include any upset or downset portions but can remain arranged substantially in a same plane that is parallel relative to planes formed by the largest planar surfaces of the first substrate 36 and second substrate 38, respectively. Because of the elimination of the spacers, the total thickness of the package 34 is thinner than the total possible thickness of the package 2 illustrated in FIG. 1. The ability to electrically isolate the lead 44 is what enables the elimination of the upset/downset portions of the leads 26, 32 illustrated in FIG. 1. Various lead and substrate implementations that involve electrical isolation will be described in additional detail throughout this document.

Figure 3:
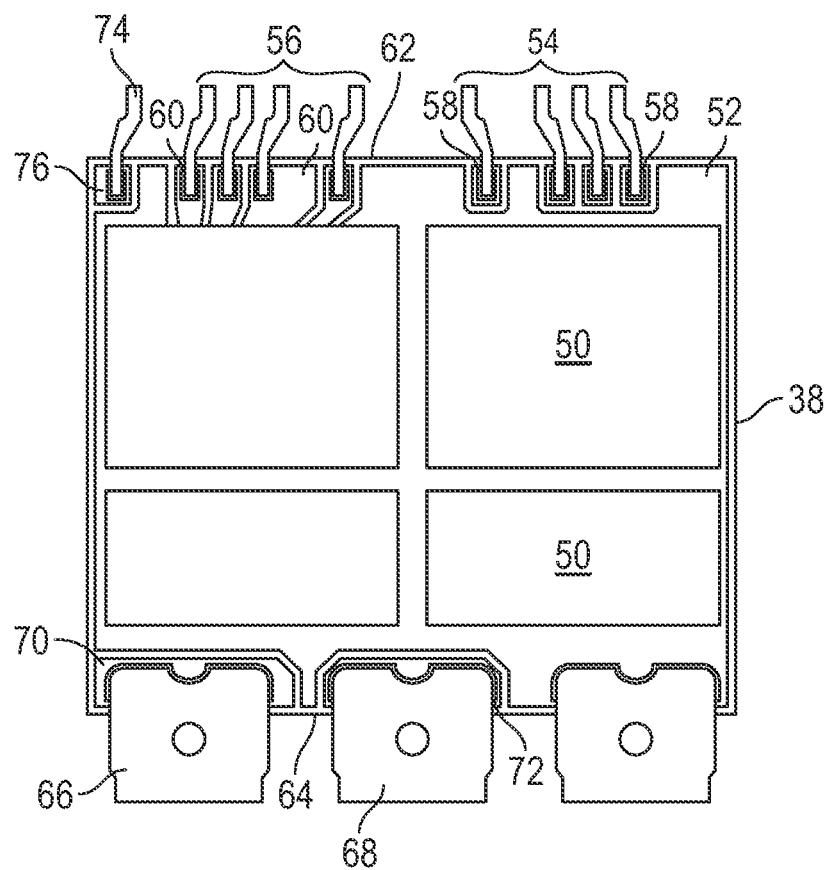
FIG. 3 is a top view of an implementation of a second substrate of a semiconductor package with leads coupled thereto.

Referring to FIG. 3, a top view of a second substrate 38 is illustrated. As illustrated, various pads 50 are coupled over the electrically conductive material 52 of the second substrate 38 to aid in coupled with the electrical devices that will be coupled thereto. While the use of the pads 50 is illustrated in the implementation illustrated in FIG. 3, in other implementations, however, electrical devices may be coupled directly to the electrically conductive material 42 of the second substrate 38. The materials that may be used to coupled the die/electrical components to the pads or electrically conductive material may be, by non-limiting example, solder, silver sintering material, copper sintering material, silver, copper, silver alloys, copper alloys, electrically conductive epoxy, thermally conductive epoxy, die attach materials, or any other material capable of bonding the semiconductor die to the pad or electrically conductive material. As illustrated, a first group of leads 54 and a second group of leads 56 are both physically coupled to the second substrate 38. The first group of leads 54 are physically coupled to the second substrate 38 but, as can be observed in FIG. 3, the leads are electrically isolated from the electrically conductive material 52 by being coupled to electrically isolated islands 58 formed in the electrically conductive material 52. In contrast, the second group of leads 56 are coupled to electrically conductive traces 60 formed in the electrically conductive material 52 of the second substrate 38 that permit the semiconductor devices to electrically connect with these leads. As illustrated, the electrically isolated first group of leads 54 is located on one side 62 of the second substrate 38 and can also be located on one side 64 of the substrate 38 as leads 66, 68 are also coupled to electrically isolated islands 70,72 in the electrically conductive material 52 of the second substrate 38. In various implementations however, electrically isolated leads may be physically coupled on only one side of the substrate. As illustrated, in other implementations, electrically isolated and electrically coupled leads may be intermixed and/or be arranged and alternating patterns as lead 74 is coupled to an electrically isolated islands 76 adjacent to the second group of leads 56 that are electrically coupled with the second substrate 38.

In various implementations, the structure illustrated with respect to second substrate 38 can also be carried out on first substrate 36 at the same time or in various implementations only on first substrate 36. The presence of the electrically isolated islands is what permits the physical and non-electrical coupling to either of the substrates. Where the electrically isolated islands include copper, they form electrically isolated copper islands.

In various implementations, the relative thicknesses of the three layers of the first substrate 36 and the second substrate 38 may be about 0.30 mm, 0.32 mm, and 0.30 mm. In various other implementations, however, the substrates 36, 38 may include one, two, or more than three layers and the thicknesses of the various layers may be greater or less than that of the implementation illustrated in FIG. 2. In various implementations, the thickness of the various leads measured in package cross-section may be between about 0.6 mm to about 0.8 mm, though the thicknesses may be greater or thinner in various implementations. In various implementations, the total package thickness may be between about 2.6 mm to about 2.4 mm. In various implementations, electrically conductive material 52 of the second substrate and electrically conductive material of the first substrate 36 may be, by non-limiting example, copper, a copper alloy, aluminum, an aluminum alloy, any combination thereof, or any other electrically conductive film, layer, or material. The leads used in various package implementations may be formed of any of a wide variety of electrically conductive materials and may or may not be coated with various other electrically conductive materials as well. The bonding materials used to physically and/or electrically couple the leads, the die, and the substrates may be, by non-example, solders, die attach films, sintering materials, or any other systems or materials used to couple semiconductor components or metallic components together.

Figure 4:
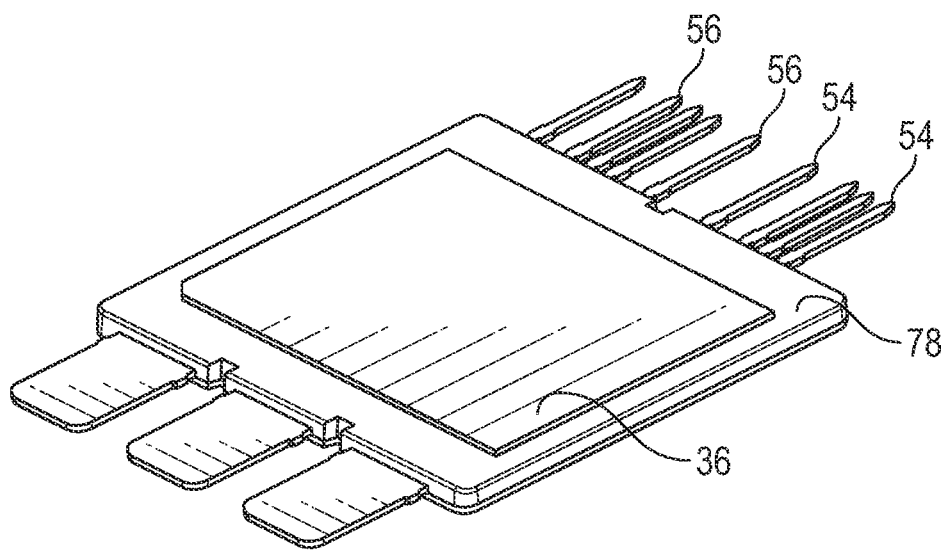
FIG. 4 is a perspective view of the implementation of a semiconductor package of FIG. 2 with an encapsulant thereon.
Figure 5:
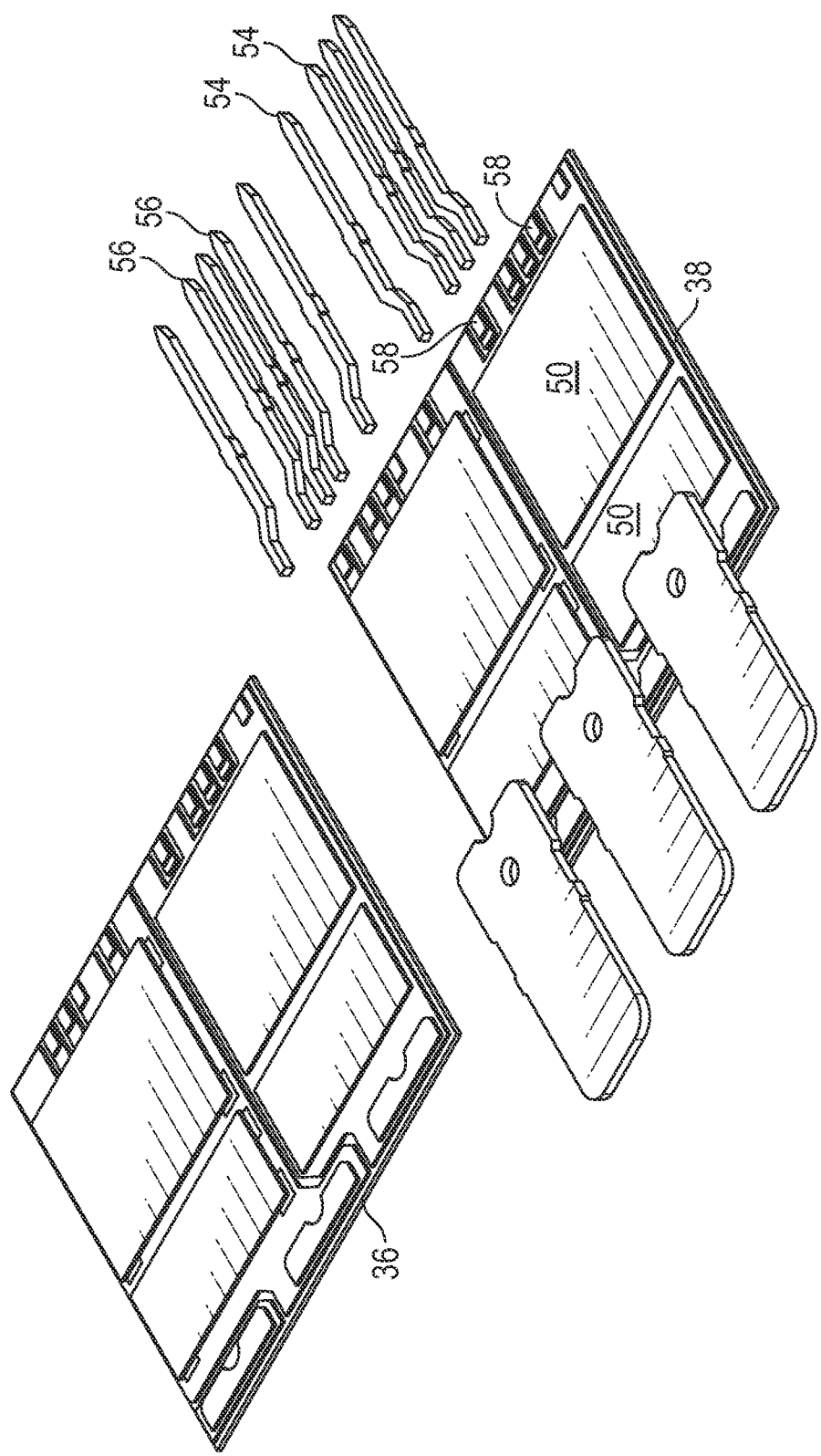
FIG. 5 is an exploded view of the implementation of the semiconductor package of FIG. 2 showing the first substrate and the second substrate.

Referring to FIG. 5, an exploded perspective view of the package of FIG. 2 is illustrated that shows the second substrate 38 and the first substrate 36 along with the first group of leads 54 and second group of leads 56. In this view it is apparent that during assembly of the package one or more electrical devices will be placed/coupled with the pads 50 and the various leads bonded/coupled to the second substrate 38 followed by the first substrate being flipped over and bonded over top of the die and the leads and a similar fashion to the bonding process used the second substrate 38. Because the first group of leads 54 is coupled only to the electrically isolated islands 58, when the leads 54 are coupled to the first substrate 36 both a physical and electrical connection are formed with the first substrate 36. Following the physical and electrical coupling of the first substrate 36 and the second substrate 38, referring to FIG. 4, an encapsulant is then applied over the first substrate and the second substrate which may leave at least a portion of the first substrate and the second substrate exposed with along with a portion of the leads 54 and 56. In various package implementations, an additional mold compound or gel compound may be applied between the first substrate 36 and the second substrate 36 around the semiconductor devices prior to application of the encapsulant 78. The process of applying the mold/gel compound will be discussed further in this document.

Figure 6:
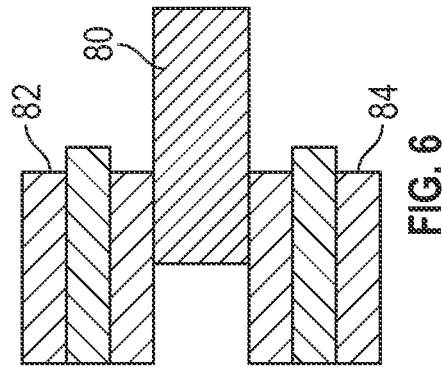
FIG. 6 is a detail cross sectional view of a lead coupled to a first substrate and a second substrate.
Figure 7:
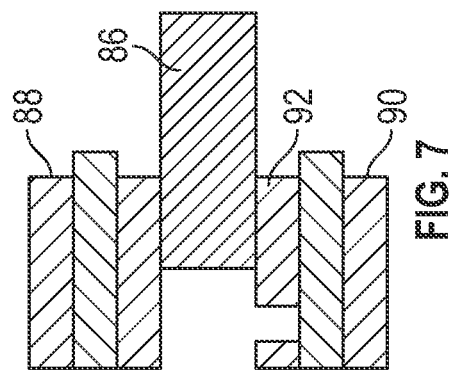
FIG. 7 is a detail cross sectional view of a lead coupled to a first substrate and a second substrate showing an electrically isolating island on the first substrate.
Figure 8:
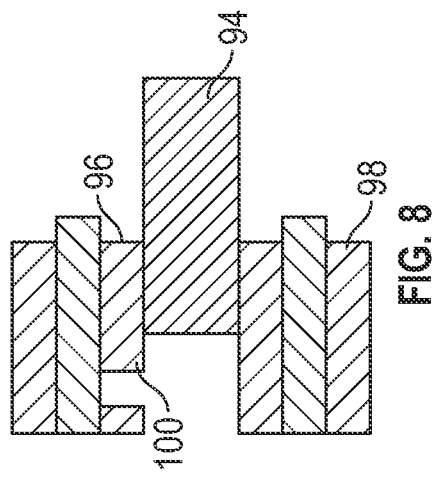
FIG. 8 is a detail cross sectional view of a lead coupled to a first substrate and a second substrate showing an electrically isolating island on the second substrate.
Figure 9:
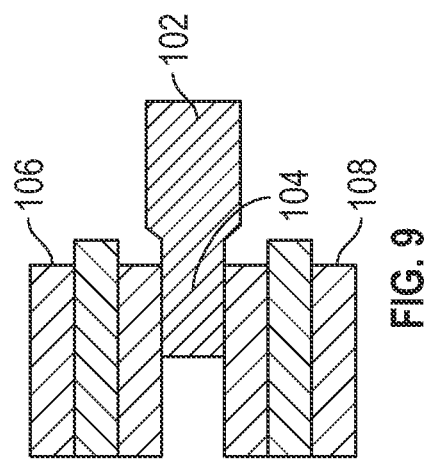
FIG. 9 is a detail cross sectional view of a coined lead coupled to a first substrate and a second substrate.
Figure 10:
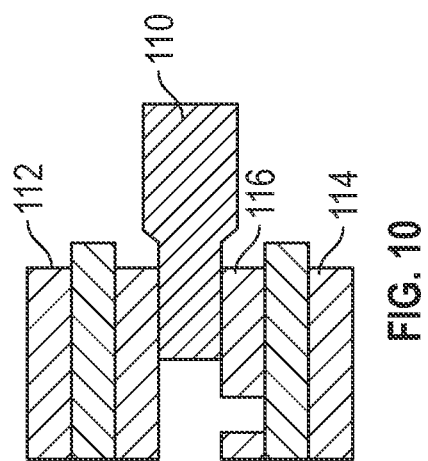
FIG. 10 is a detail cross sectional view of a coined lead coupled to an electrically isolating island on a first substrate and to a second substrate.
Figure 11:
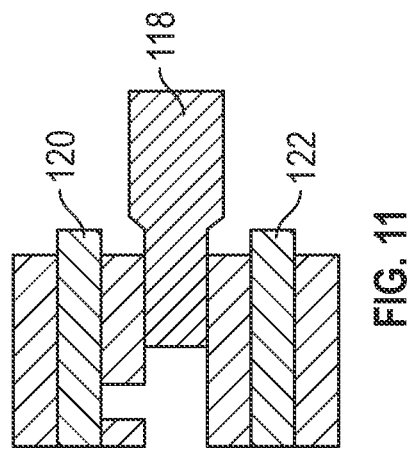
FIG. 11 is a detail cross sectional view of a coined lead coupled to an electrically isolating island on a second substrate and to a first substrate.

Referring to FIG. 6, a detail cross sectional view of a lead 80 is illustrated that is physically and electrically coupled to the first substrate 82 and second substrate 84 like the second group of leads 56 illustrated in FIG. 5. Referring to FIG. 7, a detail cross sectional view of lead 86 is illustrated that is physically coupled to the first substrate 88 and to second substrate but is only electrically coupled to the first substrate 88 because of electrically isolated island 92 formed in the surface of the electrically conductive material of the second substrate 90. The structure illustrated in FIG. 7 can be reversed as illustrated in FIG. 8 where the lead 94 is only physically coupled to first substrate 96 but also physically and electrically coupled to second substrate 98 as electrically isolated island 100 prevents electrical connection with the first substrate 96. As a way of allowing the distance between substrates to be decreased, FIG. 9 illustrates how the lead 102 can be coined/thinned at a first end 104 that is ultimately physically coupled (and in this case, electrically coupled) with first substrate 106 and with second substrate 108. FIG. 10 illustrates a coined lead 110 physically and electrically coupled with first substrate 112 and physically coupled only with the second substrate 114 through electrically isolating island 116. FIG. 11 illustrates the reverse physical arrangement with coined lead 118 which is physically coupled only to first substrate 120 and physically and electrically coupled the second substrate 122.

In various semiconductor package implementations, various implementations of methods of forming a semiconductor package may be utilized. Implementations of the method may include physically and electrically coupling a first group of leads to a first substrate. The leads and substrate type used in this method implementation may be any disclosed in this document. The method may also include physically coupling a second group of leads to the first substrate using electrically isolated islands that correspond with each of the second group of leads. In some implementations, each lead may have only one corresponding electrical isolated island; in other implementations, however, two or more of the leads may be coupled to the same electrically isolated island. The method may also include physically and electrically coupling a second substrate to the first group of leads and to the second group of leads. In various method implementations, if the first group of leads is only to be physically coupled to the first substrate, the order of the coupling steps changes correspondingly meaning that the electrically conductive islands are now being coupled with the first group of leads rather than with the second group of leads. Those of ordinary skill the art will readily appreciate the various combinations of method steps that may be formed with each of a wide variety of leads to determine which are physically and electrically and those that are only physically coupled to either of the two substrates during various methods of forming a semiconductor package.

In various method implementations one or more semiconductor die and/or various electrical components, whether active or passive, may be coupled between the first substrate and the second substrate. In various method implementations the one or more semiconductor die and/or electrical components may be coupled to the first substrate at the same time as or along with the coupling of the first group of leads and the second group of leads. In other implementations however, the one or more semiconductor die and/or the electrical components may be coupled to the second substrate prior to the second substrate being physically and electrically coupled with the first group of leads and with the second group of leads. In some obligations, one or more of the semiconductor die and/or one or more of the electrical components may be coupled to either or both of the first substrate and the second substrate prior to the physical and electrical coupling of the second substrate to the first substrate through the one or more of the leads.

In various method implementations, the method may include coining/thinning the first group of leads and a second group of leads. This process of coining/thinning may take place prior to the leads being physically coupled to the first substrate or may take place as part of the coupling process in various implementations. In other implementations, the ends of the leads may be thinned by etching some portion of the ends of the leads, such as, by non-limiting example, half etching the ends of the leads. In various method implementations, the various leads may be coupled to two or more sides of the semiconductor package. For semiconductor packages that are not rectangular, the various leads may be coupled along various edges, sides, or at various locations along a perimeter of the package.

In various package implementations, the thickness of the package can be a challenge to achieving encapsulation between the first substrate and the second substrate. In particular implementations, the use of a pre-mold/premolded lead frame/lead/set of leads may be utilized to assist in the molding process. Referring to FIG. 13, a lead 124 is illustrated that has a molded material 126 formed on both sides of the lead that is designed to couple with the edges 132, 134 of the first substrate 128 and second substrate 130 to form a seal between the edges 132, 134 and the lead 124. Because of the presence of the seal, mold/gel material 136 is prevented from flowing out from around the leads and the edges 132, 134 of the first substrate 128 and the second substrate 130 during the filling/molding process as indicated by arrow 138. Without the presence of the pre-mold 126, during the molding process there may be no dam or other barrier to prevent flow of the material out between the first substrate 128 and second substrate 130 is illustrated in FIG. 12 around lead 124. In various implementations, the mold/gel material may be, by non-limiting example, a gel fill material, a chip coating material, an epoxy, a resin, an epoxy resin, mold compound, any combination thereof, or any other material capable of filling the space between the first substrate and the second substrate. In various implementations, no mold/gel material may be used, and the space between the first substrate and the second substrate may be left separated by air to form an air gap. The use of an air gap may be used where the size of the semiconductor die in the package is smaller relative to the size of the first substrate and the second substrate.

In various method implementations the pre-mold may be applied to the lead 124 prior to coupling with either the first substrate 128 or second substrate 130. In implementations, the pre-mold material 196 may be applied following coupling of the lead 124 to either or both the first substrate 128 and the second substrate 130. In various implementations where coined leads are employed, a coined lead may be used in place of the lead 124 in any of the method or structure implementations disclosed herein. The various gel/mold materials used internally in the package may be, by non-example, a silicone, an epoxy, a resin, any combination thereof, or any other molding reporting compound. In various method implementations, the gel/mold material may be delivered by capillary flow into the space between the first substrate 128 and the second substrate 130. In other implementations, the material may be pre-dispensed prior to coupling of the first substrate 128 of the second substrate 130 and then spread as the first substrate 128 is pressed/placed over the second substrate 130. In various implementations the use of the mold/gel material 136 may aid in increasing creepage or clearance and the package.

The various package implementations disclosed herein may allow the package to have solid support between the first substrate and the second substrate which can improve clamping during the encapsulation process and may also ease the control of the stack of substrates and leads at the three dimensional reflow process. The use of the electrically isolated islands may also allow the leadframe that contains the various leads to be flat without having to include any upset or downset portions. This ability to work with a flat leadframe may reduce the overall complexity of the leadframe manufacturing process and reduce cost. The result of the use of electrically isolated islands also has the effect that the electrical connection of each pins/terminal to the first substrate and the second substrate is defined by the patterned and electrically conductive material on each substrate.

Various implementations of semiconductor packages like those disclosed herein may be used for a wide variety of semiconductor die types to form a wide variety of electrical components. For example, the semiconductor package implementations disclosed herein may permit a spacer-free half bridge dual side cooled power module to be formed. The ability to dual side cool the package may be a direct result of allowing material of the first substrate and material of the second substrate to be exposed through the encapsulant on both sides of the package that permits cooling components to be attached to each side as in the implementation illustrated in FIG. 2. In other implementations, the use of a premolded lead frame to increase clearance/creepage distance may enable the package to be used for an inverter system.

While in various implementations disclosed in this document the use of spacers has not been illustrated, spacers may still be employed to help support the first substrate and second substrate and locations where a semiconductor die or electrical component is not present. Because of the thickness of the package designs disclosed herein, however, the thickness of the spacer may be reduced and/or the size of the spacer increased as a result. A larger spacer can enhance thermal transfer through the package from the electrical components. Various package designs disclosed herein may also have a lower bill of materials cost because any spacers used may be able to be bare metal and thinner than in packages that include leads with upset and downset portions. Also, in various implementations, standard thickness substrates like direct bonded copper substrates may be able to be employed in a package that has thinner overall thickness than that ordinarily possible with such substrates.

Additionally, because the package is thinner overall, less mold compound is needed which can further reduce cost. Because in various package implementations the use of multiple solder layers in combination with spacers to achieve a precisely controlled height above each die and/or electrical component is not needed, processes involved in performing true height of the solders or using solder preforms may not be required. Also, in various method implementations, the thinner thickness of the package may permit the need for no grinding of the encapsulant by eliminating the needed to overmold. Because no preforms may be used, no solder preform pick and place operations may be needed in the package assembly process to ensure that solders reach proper heights in various locations on the package during assembly. In some implementations the dispensing of solder may also not be used in favor of solder printing using stencil or squeegee printing techniques which may reduce the cost and/or complexity of the process. The ability to eliminate the upset and down set portions of the leads may also allow the manufacturing process to be carried out in a panel form with one single planar lead frame panel used during processing of multiple semiconductor packages. Also, during manufacturing, the thinner package may make it easier to use x-ray metrology because the electrically conductive layers included in the package may be thinner.

In various method and package implementations disclosed herein the use of holes through the material of the first substrate and/the second substrate may be employed to reduce the risk of voids being formed during the gel/mold process. In various implementations, the warpage of the package may be managed by designing the first substrate and/or the second substrate in particular ways to manage the stress and/or employing particular mold compound that have desired warpage characteristics.

Where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a first substrate comprising a first group of leads physically coupled thereto and a second group of leads physically coupled thereto;
   a second substrate coupled over the first substrate and physically coupled to the first group of leads and the second group of leads; and
   one or more semiconductor die coupled between the first substrate and the second substrate;
   wherein the second group of leads is electrically isolated from the first substrate;
   wherein the first group of leads is electrically coupled to the one or more semiconductor die through the first substrate;
   wherein each lead of the first group of leads and each lead of the second group of leads are coupled between the first substrate and the second substrate; and
   wherein the first group of leads and the second group of leads are configured to couple the semiconductor package to an external device.

2. The package of claim 1, wherein the second group of leads are each coupled to a corresponding electrically isolated copper island formed in a layer of copper on the first substrate.

3. The package of claim 1, further comprising an encapsulant in a space between the first substrate and the second substrate.

4. The package of claim 1, wherein the first group of leads and the second group of leads are both coupled on a same side of the first substrate and on a same side of the second substrate.

5. The package of claim 1, wherein the first group of leads and the second group of leads are coupled on different sides of the first substrate and the second substrate.

6. The package of claim 1, further comprising one or more leads physically and electrically coupled to the first substrate and to the second substrate.

7. The package of claim 1, wherein an end of each lead of the first group of leads and an end of each lead of the second group of leads is coined.

8. The package of claim 1, further comprising a pre-mold encapsulant formed around the first group of leads and the second group of leads.

9. A semiconductor package comprising:
   a first substrate comprising a first group of leads physically coupled thereto and a second group of leads physically coupled thereto, the second group of leads physically coupled to corresponding electrically isolated islands coupled one of in or on the first substrate;
   a second substrate coupled over the first substrate and physically coupled to the first group of leads and the second group of leads; and
   one or more semiconductor die coupled between the first substrate and the second substrate:
   wherein the first group of leads and the second group of leads are configured to couple the semiconductor package to an external device.

10. The package of claim 9, wherein the corresponding electrically isolated islands are comprised in the first substrate.

11. The package of claim 9, wherein the first group of leads and the second group of leads are both coupled on a same side of the first substrate and on a same side of the second substrate.

12. The package of claim 9, wherein the first group of leads and the second group of leads are coupled on different sides of the first substrate and the second substrate.

13. The package of claim 9, further comprising one or more leads physically and electrically coupled to the first substrate and to the second substrate.

14. The package of claim 9, wherein an end of each lead of the first group of leads and an end of each lead of the second group of leads is coined.

15. The package of claim 9, further comprising a pre-mold encapsulant formed around the first group of leads and the second group of leads.

16. A method of forming a semiconductor package, the method comprising:
   physically and electrically coupling a first group of leads to a first substrate;
   physically coupling a second group of leads to the first substrate using corresponding electrically isolated islands coupled one of in or on the first substrate;
   physically and electrically coupling a second substrate to the first group of leads and to the second group of leads; and
   coupling one or more semiconductor die between the first substrate and the second substrate;
   wherein the first group of leads and the second group of leads are configured to couple the semiconductor package to an external device.

17. The method of claim 16, further comprising coining the first group of leads and the second group of leads.

18. The method of claim 16, further comprising applying a pre-mold encapsulant around the first group of leads and around the second group of leads.

19. A method of claim 16, wherein the corresponding electrically isolated islands are comprised in the first substrate.

20. The method of claim 16, wherein the first group of leads and the second group of leads are coupled on one of a same side of the first substrate or different sides of the first substrate.

* * * * *